(12) United States Patent
Fan et al.

(10) Patent No.: US 7,371,610 B1
(45) Date of Patent: May 13, 2008

(54) PROCESS FOR FABRICATING AN INTEGRATED CIRCUIT PACKAGE WITH REDUCED MOLD WARPING

(75) Inventors: Chun Ho Fan, Sham Tseng (HK); Mohan Kirloskar, Cupertino, CA (US); Neil McLellan, Danville, CA (US)

(73) Assignee: ASAT Ltd., Tsuen Wan, New Territories (HK)

( * ) Notice: Subject to any disclaimer, the term of this patent is extended or adjusted under 35 U.S.C. 154(b) by 336 days.

(21) Appl. No.: 10/990,008

(22) Filed: Nov. 16, 2004

Related U.S. Application Data

(63) Continuation-in-part of application No. 10/323,657, filed on Dec. 20, 2002, now Pat. No. 6,979,594, which is a continuation-in-part of application No. 10/197,832, filed on Jul. 19, 2002, now Pat. No. 6,800,948.

(51) Int. Cl.
*H01L 21/44* (2006.01)

(52) U.S. Cl. .................. 438/112; 438/113; 438/124; 257/E21.499; 257/E21.502

(58) Field of Classification Search ............ 438/25–26, 438/15, 51, 55, 112, 124, 126–127, 113–114; 257/E21.499, E21.5, E21.502, E21.503
See application file for complete search history.

(56) References Cited

U.S. PATENT DOCUMENTS

| | | | |
|---|---|---|---|
| 4,698,662 A | 10/1987 | Young et al. | |
| 5,172,213 A | 12/1992 | Zimmerman | |
| 5,297,333 A | 3/1994 | Kusaka | |
| 5,311,060 A | 5/1994 | Rostoker et al. | |
| 5,329,423 A | 7/1994 | Scholz | |
| 5,339,216 A | 8/1994 | Lin et al. | |
| 5,435,732 A | 7/1995 | Angulas et al. | |
| 5,444,025 A | 8/1995 | Sono et al. | |
| 5,493,153 A | 2/1996 | Arikawa et al. | |
| 5,521,435 A | 5/1996 | Mizukoshi | |
| 5,609,889 A | 3/1997 | Weber | |
| 5,610,442 A | 3/1997 | Schneider et al. | |
| 5,639,694 A | 6/1997 | Diffenderfer et al. | |

(Continued)

FOREIGN PATENT DOCUMENTS

DE 100 15 962 10/2001

(Continued)

OTHER PUBLICATIONS

U.S. Appl. No. 10/647,696, Mohan Kirloskar et al., "Improved Ball Grida Array Package and Process for Manufacturing Same" filed Aug. 25, 2003.

(Continued)

*Primary Examiner*—Thanhha S. Pham
(74) *Attorney, Agent, or Firm*—Morrison & Foerster LLP

(57) ABSTRACT

A process for fabricating an integrated circuit package includes mounting a semiconductor die on a first surface of a metal carrier and forming electrical connections between the semiconductor die and ones of a plurality of contacts on the metal carrier. Next, using a molding material in a mold, the semiconductor die and the contacts are molded in the molding material, between the metal carrier and a metal strip. The metal carrier and the metal strip are etched away and the integrated circuit package is singulated.

26 Claims, 8 Drawing Sheets

U.S. PATENT DOCUMENTS

| | | | |
|---|---|---|---|
| 5,650,663 | A | 7/1997 | Parthasarathi |
| 5,672,548 | A | 9/1997 | Culnane et al. |
| 5,679,978 | A | 10/1997 | Kawahara et al. |
| 5,705,851 | A | 1/1998 | Mostafazadeh et al. |
| 5,736,785 | A | 4/1998 | Chiang et al. |
| 5,773,362 | A | 6/1998 | Tonti et al. |
| 5,877,552 | A | 3/1999 | Chiang |
| 5,898,219 | A | 4/1999 | Barrow |
| 5,901,043 | A | 5/1999 | Lin et al. |
| 5,903,050 | A | 5/1999 | Thurairajaratnam |
| 5,909,057 | A | 6/1999 | McCormick et al. |
| 5,959,353 | A | 9/1999 | Tomita |
| 5,977,626 | A | 11/1999 | Wang et al. |
| 5,981,310 | A | 11/1999 | DiGiacomo et al. |
| 5,985,695 | A | 11/1999 | Freyman et al. |
| 5,986,885 | A | 11/1999 | Wyland |
| 6,016,013 | A | 1/2000 | Baba |
| 6,020,637 | A | 2/2000 | Karnezos |
| 6,037,658 | A | 3/2000 | Brodsky et al. |
| 6,051,888 | A | 4/2000 | Dahl |
| 6,104,093 | A | 8/2000 | Caletka et al. |
| 6,122,171 | A | 9/2000 | Akram et al. |
| 6,175,161 | B1 | 1/2001 | Goetz et al. |
| 6,181,569 | B1 | 1/2001 | Chakravorty |
| 6,236,568 | B1 | 5/2001 | Lai et al. |
| 6,251,706 | B1 | 6/2001 | Paniccia |
| 6,313,521 | B1 | 11/2001 | Baba |
| 6,323,066 | B2 | 11/2001 | Lai et al. |
| 6,349,032 | B1 | 2/2002 | Chan et al. |
| 6,388,335 | B1 | 5/2002 | Lam |
| 6,414,385 | B1 | 7/2002 | Huang et al. |
| 6,441,499 | B1 | 8/2002 | Nagarajan et al. |
| 6,462,405 | B1 | 10/2002 | Lai et al. |
| 6,469,381 | B1 | 10/2002 | Houle et al. |
| 6,507,104 | B2 | 1/2003 | Ho et al. |
| 6,525,421 | B1 | 2/2003 | Chia et al. |
| 6,631,078 | B2 | 10/2003 | Alcoe et al. |
| 6,656,770 | B2 | 12/2003 | Atwood et al. |
| 6,734,552 | B2 | 5/2004 | Combs |
| 6,800,948 | B1 | 10/2004 | Martin et al. |
| 6,821,821 | B2 * | 11/2004 | Fjelstad ...................... 438/124 |
| 6,849,940 | B1 | 2/2005 | Chan et al. |
| 2001/0015492 | A1 | 8/2001 | Akram et al. |
| 2002/0005578 | A1 | 1/2002 | Kodoma et al. |
| 2002/0006718 | A1 | 1/2002 | Distefano |
| 2002/0180035 | A1 | 12/2002 | Huang et al. |
| 2002/0185734 | A1 | 12/2002 | Zhao et al. |
| 2003/0034569 | A1 | 2/2003 | Caletka et al. |
| 2003/0075812 | A1 | 4/2003 | Cheng et al. |
| 2003/0160309 | A1 | 8/2003 | Punzalan et al. |
| 2003/0189245 | A1 | 10/2003 | Fang |
| 2003/0226253 | A1 | 12/2003 | Mayer |

FOREIGN PATENT DOCUMENTS

| | | |
|---|---|---|
| JP | 02-278783 | 11/1990 |
| JP | 09-232690 | 9/1997 |

OTHER PUBLICATIONS

U.S. Appl. No. 10/643,961, Chun Ho Fan et al., "Improved Ball Grid Array Package and Process for Manufacturing Same" filed Aug. 20, 2003.

U.S. Appl. No. 10/372,421, Joseph Andrew Martin et al., "Improved Ball Grid Array Package" filed Feb. 24, 2003.

U.S. Appl. No. 10/323,657, Chun Ho Fan et al., "Process for Manufacturing Ball Grid Array Package" filed Dec. 20, 2002.

* cited by examiner

PROCESS FOR FABRICATING AN INTEGRATED CIRCUIT PACKAGE WITH REDUCED MOLD WARPING

CROSS REFERENCE TO RELATED APPLICATIONS

This is a continuation-in-part of U.S. patent application Ser. No. 10/323,657 entitled, Process For Manufacturing Ball Grid Array Package, filed Dec. 20, 2002 now U.S. Pat. No. 6,979,594, which is a continuation-in-part of Ser. No. 10/197,832, now U.S. Pat. No. 6,800,948 entitled, Improved Ball Grid Array Package, filed Jul. 19, 2002.

FIELD OF THE INVENTION

The present invention relates in general to integrated circuit packaging and more particularly to a process for fabricating an integrated circuit package including features to reduce warping.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die attach pad (paddle) is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features of outer leads is eliminated and no outer leads are necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, issued May 8, 2001, the contents of which are incorporated herein by reference.

In another process, integrated circuit packages are gang fabricated by selectively plating up die attach pads and contact pads on a metal carrier strip. Singulated IC dice are then mounted on respective die attach pads using conventional die mount and epoxy techniques. After curing the epoxy, the dice are gold wire bonded to respective selectively plated contact pads. The packages are then molded in plastic or resin resulting in molded packages on a metal carrier strip. The carrier strip is then etched away and the individual packages are singulated by, for example, saw singulation. Again, the bottom of the die attach pad is exposed, thereby eliminating mold delamination problems at the bottom of the die attach pad and increasing moisture sensitivity performance. Again, the thermal performance of the IC package is improved by providing a direct thermal path from the exposed die attach pad to the motherboard. All of the packages on the carrier strip are molded together by gang molding rather than molding individual pockets for each package. Clearly this increases manufacturing efficiency as compared to molding of individual packages.

The resulting package suffers from disadvantages, however. In particular, gang molding of the strip results in warping of the gang strip as a result of differences in the coefficients of thermal expansion in the carrier strip, the plastic or resin molding material and the integrated circuit dice. Also, each of the carrier strip, the molding material and the integrated circuit dice have different values of Young's Modulus and specific gravity. With these different material properties, warping of the molded strip results after molding.

For some packages, the use of a clear or transparent molding material is desirable. In such cases, no filler material is added to the molding material. The filler material is traditionally added to the molding material to change the coefficient of thermal expansion to more closely approach that of the Silicon material of the integrated circuit die. Without the filler, the mismatch in coefficient of thermal expansion between the mold compound, the integrated circuit die and the metal carrier is high, causing further warping. Also, the molding material shrinks after post mold curing due to cross linking of the resin in the mold compound. In extreme cases, warping of the strip prohibits singulation of individual packages. Due to warping problems, packages with clear or transparent mold material are not manufactured by gang fabrication on a metal carrier, as described above.

Further IC package improvements are still desirable and are driven by industry demands for increased thermal and electrical performance and decreased size and cost of manufacture.

SUMMARY OF THE INVENTION

In one aspect of the present invention, there is provided a process for fabricating an integrated circuit package including mounting a semiconductor die on a first surface of a metal carrier and forming electrical connections between the semiconductor die and ones of a plurality of contacts on the metal carrier. Next, using a molding material in a mold, the semiconductor die and the contacts are molded in the molding material, between the metal carrier and a metal strip. The metal carrier and the metal strip are etched away and the integrated circuit package is singulated.

In another aspect of the present invention, there is provided a process for fabricating a plurality of integrated circuit packages. The process includes mounting a plurality of semiconductor dice on a first surface of a metal carrier and forming electrical connections between the semiconductor dice and respective ones of a plurality of contacts on the metal carrier, molding using a molding material in a mold to thereby mold the semiconductor dice and the contacts in the molding material, between the metal carrier and a metal strip, etching away the metal carrier and the metal strip, and singulating the integrated circuit packages.

Advantageously, the metal strip provides additional support to the package to inhibit warping of the packages on the metal carrier. In one aspect, the coefficient of thermal expansion of the metal strip is similar to the coefficient of thermal expansion of the metal carrier. The use of a metal carrier and metal strip with similar coefficients of thermal expansion further inhibits warping of the packages on the metal carrier. Such a metal strip also allows the use of a transparent molding material without the addition of fillers.

BRIEF DESCRIPTION OF THE DRAWINGS

The invention will be better understood with reference to the drawings and to the following description, in which.

DETAILED DESCRIPTION OF THE PREFERRED EMBODIMENTS

Figure 1A:
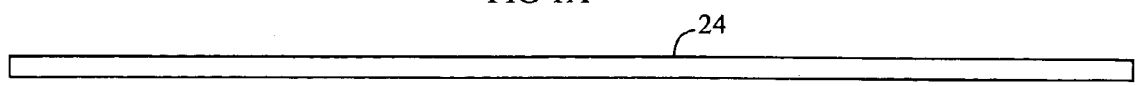
FIGS. 1A to 1H show processing steps for fabricating integrated circuit packages according to one embodiment of the present invention.

Referring to the figures, a process for fabricating an integrated circuit package will be described. The integrated circuit package is indicated generally by the numeral 20. The process includes mounting a semiconductor die 22 on a first surface of a metal carrier 24 and forming electrical connections between the semiconductor die 22 and ones of a plurality of contacts 26 on the metal carrier 24. Next, the semiconductor die 22 and the contacts 26 are molded in a molding material 28, between the metal carrier 24 and a metal strip 30. The metal carrier 24 and the metal strip 30 are etched away and the integrated circuit package 20 is singulated.

The process for fabricating the integrated circuit package 20 will now be described with particular reference to FIGS. 1A to 1H. For ease of illustration, the Figures show the processing steps for fabricating three integrated circuit packages 20. It will be understood, however, that the integrated circuit packages 20 are gang fabricated and then singulated by sawing or punching. More than three integrated circuit packages 20 are generally gang fabricated together on the metal carrier 24.

FIG. 1A shows a sectional side view of a Cu (copper) panel substrate that forms the metal carrier 24. As indicated above, the metal carrier 24 includes a plurality of sections with a single integrated circuit package 20 being fabricated on each section. Only three such integrated circuit packages 20 are shown in the Figures for the purpose of simplicity.

Figure 1B:
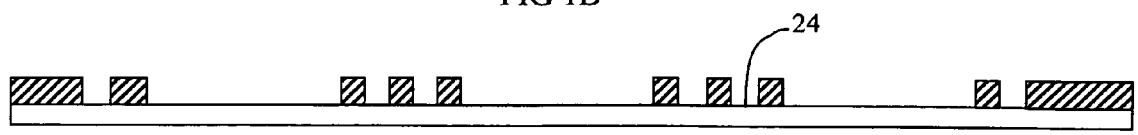

Referring to FIG. 1B, the metal carrier 24 is coated with a layer of photo-imageable solder mask such as a photo-imageable epoxy. The photo-imageable solder mask is imaged by exposure of the solder mask to ultraviolet light masked by a photo-tool and the solder mask is developed to provide the plating mask shown in FIG. 1B. The solder mask is thereby patterned to provide pits in which portions of the upper surface of the metal carrier 24 are exposed.

Figure 1C:
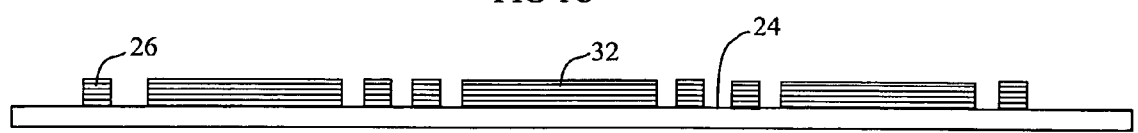

Layers of metals are then deposited by selectively plating on the exposed portions of the metal carrier 24, in the pits in the solder mask. Different plating options are possible. Thus, metal layers are plated on the upper surface of the metal carrier 24 to form a die attach pad 32 F and the plurality of contacts 26 that circumscribe the die attach pad 32, for each package manufactured on the metal carrier 24. In one option, five layers of metals are deposited, including a layer of Au (gold) (for example, 20 microinches) is deposited, followed by layers of Ni (nickel) (for example, 40 microinches) and Cu (3-4 mils). Final layers of Ni (for example, 40 microinches) and Au (for example, 20 microinches) are then deposited. After plating, the photo-imageable solder mask is stripped away (FIG. 1C).

Other plating options are available including, for example any of the following options: successive layers of palladium, nickel and gold; successive layers of palladium and gold; successive layers of palladium, nickel, palladium and gold; successive layer of palladium, nickel and silver; and successive layers of copper, nickel and gold. A metal thickness of between 2 and 40 microinches for each layer is typically suitable.

Figure 1D:
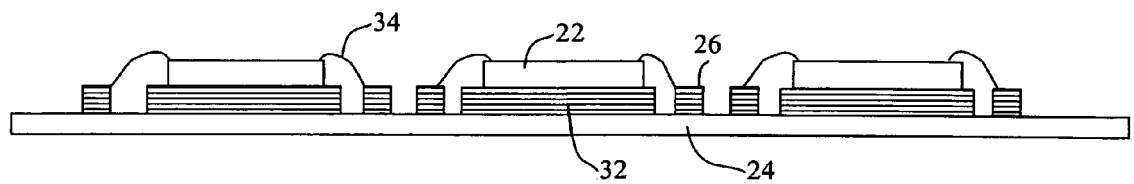

Referring now to FIG. 1D, singulated semiconductor dice 22 are then conventionally mounted via epoxy (or other suitable means) to the die attach pads 32, each semiconductor die 22 being mounted to a respective die attach pad 32. Gold wire bonds 34 are then bonded between each semiconductor die 22 and respective ones of the contacts 26.

Figure 1E:
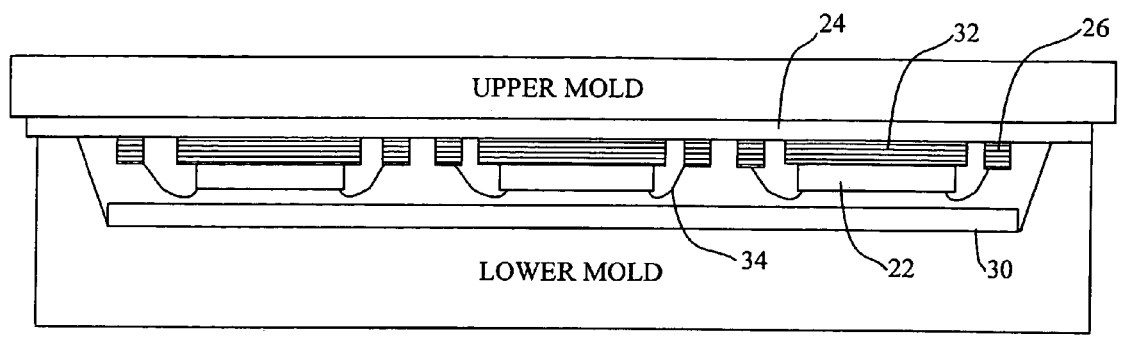
Figure 1F:
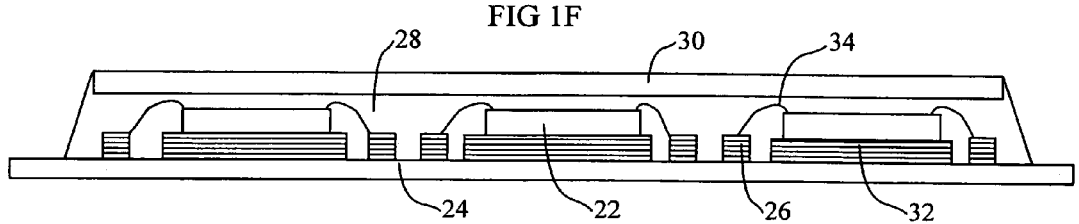

The metal strip 30, referred to above, is a copper metal strip and is suitably sized and shaped for molding with the metal carrier 24 including the die attach pad 32, the semiconductor die 22, the contacts 26 and the wire bonds 34. As shown in FIGS. 1E and 1F, the metal strip 30 is manufactured such that it is compatible with the metal carrier 24.

The metal strip 30 is placed on a lower surface of a lower mold die, in a mold cavity. The metal carrier 24 is then clamped to a surface of an upper mold die, at the top of the mold cavity such that the semiconductor die 22 protrudes from the metal carrier 24 into the mold cavity. Clamping of the metal carrier 24 is achieved by closing the upper and lower mold dies and pinching the edge of the metal carrier 24 in between, as is shown in FIG. 1E.

After the metal carrier 24 is clamped to a surface of the upper mold die, encapsulation in the molding material 28 follows. Thus, each integrated circuit package 20 is encapsulated in the molding material 28. The molding material 28 surrounds the wire bonds 34 and the semiconductor die 22, filling the mold cavity between the metal carrier 24 and the metal strip 30. After sufficient curing time, the molded packages 20 are removed from the mold in the form of a molded strip (FIG. 1F). As shown, the metal carrier 24 and the metal strip 30 are exposed, forming the lower and upper surfaces of the molded strip.

Figure 1G:
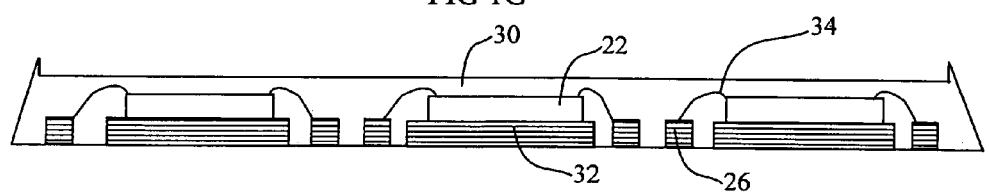

Next the molded strip is subjected to an alkaline etch via full immersion etching to remove the metal carrier 24 and the metal strip 30 and thereby expose the die attach pad 32 and the contacts 26 (FIG. 1G).

Figure 1H:
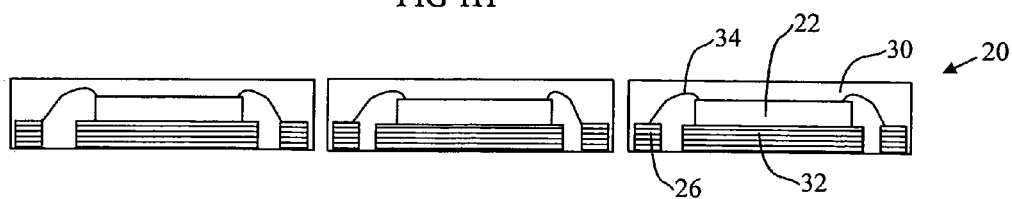

After etching, the individual packages 20 are electrically isolated, and therefore testing of individual packages 20 is possible. The packages 20, however, are still mechanically joined by the molding material 28. Singulation of the individual integrated circuit packages 20 is performed by, for example, saw singulation, resulting in individual integrated circuit packages 20 as shown in FIG. 1H.

Reference is now made to FIGS. 2A to 2H to describe a process for fabricating an integrated circuit package 20 according to another embodiment of the present invention. It will be appreciated that many of the process steps of the present embodiment are similar to those of the first described embodiment.

Figure 2A:
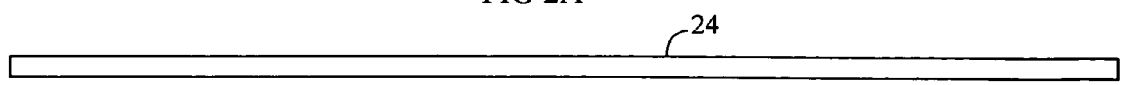
FIGS. 2A to 2H show processing steps for fabricating integrated circuit packages according to another embodiment of the present invention.

FIG. 2A shows a sectional side view of the Cu metal carrier 24 as shown in FIG. 1A.

Figure 2B:
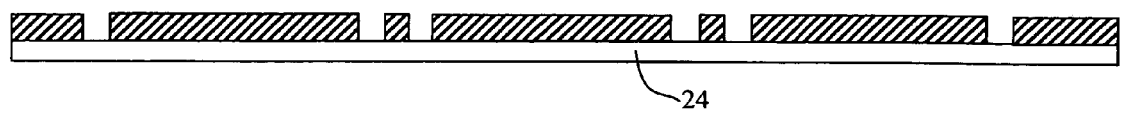

Referring to FIG. 2B, the metal carrier 24 is coated with a layer of photo-imageable solder mask such as a photo-imageable epoxy and the photo-imageable solder mask is imaged by exposure to ultraviolet light masked by a photo-tool. The solder mask is then developed to provide the plating mask shown in FIG. 2B. In the present embodiment, the solder mask is thereby patterned to provide pits in which portions of the upper surface of the metal carrier 24 are exposed for plating up of the contacts 26. No pits are provided for plating up any die attach pads, however.

Figure 2C:
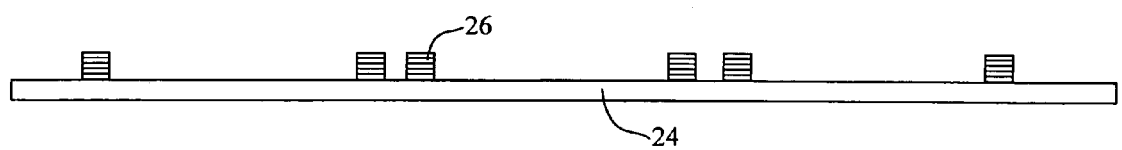

Layers of metals are then deposited by selectively plating on the exposed portions of the metal carrier 24, in the pits in the solder mask. Again, different plating options are possible. Thus, metal layers are plated on the upper surface of the metal carrier 24 to form a plurality of contacts 26 for each package manufactured on the metal carrier 24. After plating, the photo-imageable solder mask is stripped away (FIG. 2C).

Figure 2D:
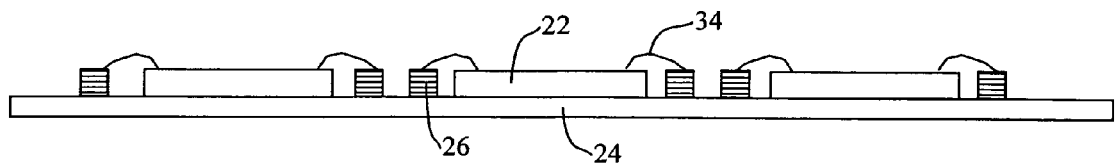
Figure 2E:
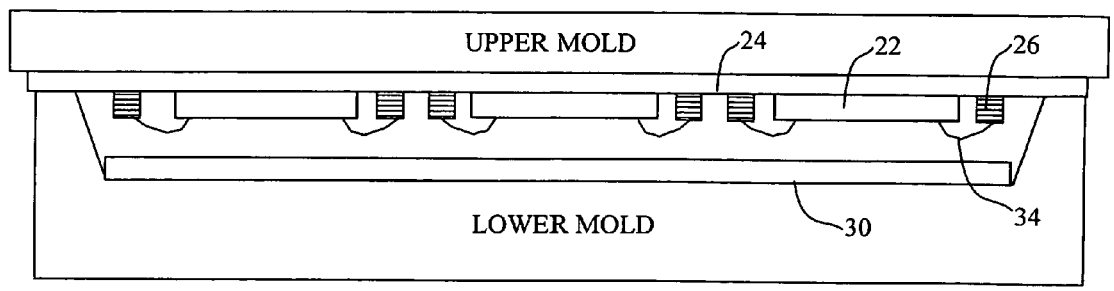

Referring now to FIG. 2D, singulated semiconductor dice 22 are then conventionally mounted via epoxy (or other suitable means) to the metal carrier 24, each semiconductor die 22 being mounted in a respective location on the metal carrier 24 such that each semiconductor die 22 is circumscribed by respective ones of the contacts 26. Gold wire bonds 34 are then bonded between each semiconductor die 22 and respective ones of the contacts 26.

As in the first-described embodiment, a copper metal strip 30 is placed on the lower surface of the lower mold die, in the mold cavity. The metal carrier 24 is then clamped to a surface of the upper mold die, at the top of the mold cavity such that the semiconductor die 22 protrudes from the metal carrier 24 into the mold cavity. Clamping of the metal carrier 24 is achieved by closing the upper and lower mold dies and pinching the edge of the metal carrier 24 in between, as is shown ii FIG. 2E.

Figure 2F:
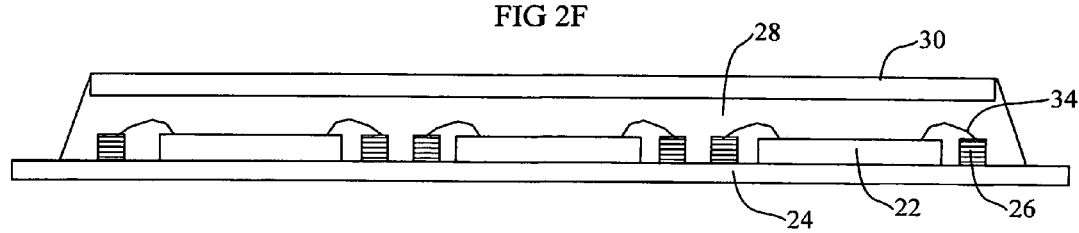

After the metal carrier 24 is clamped to a surface of the upper mold die, encapsulation in the molding material 28 follows. Thus, each integrated circuit package 20 is encapsulated in the molding material 28. The molding material 28 surrounds the wire bonds 34 and the semiconductor die 22, filling the mold cavity between the metal carrier 24 and the metal strip 30. After sufficient curing time, the molded packages 20 are removed from the mold in the form of a molded strip (FIG. 2F). As shown, the metal carrier 24 and the metal strip 30 are exposed, forming the lower and upper surfaces of the molded strip.

Figure 2G:
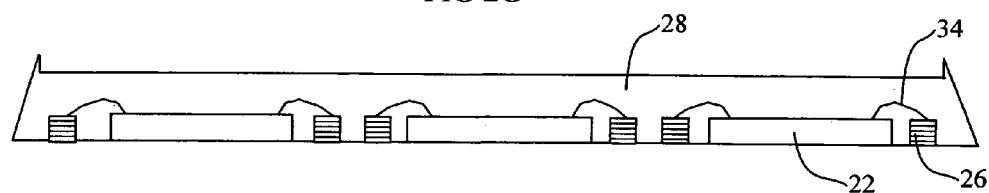

Next the molded strip is subjected to an alkaline etch via full immersion etching to remove the metal carrier 24 and the metal strip 30 and thereby expose the semiconductor die 22 and the contacts 26 (FIG. 2G).

Figure 2H:
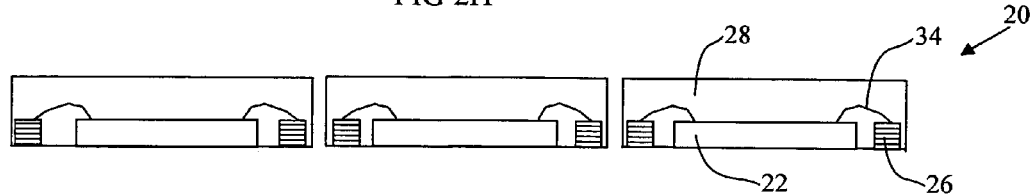

After etching, the individual packages 20 are electrically isolated, and therefore testing of individual packages 20 is possible. The packages 20, however, are still mechanically joined by the molding material 28. Singulation of the individual integrated circuit packages 20 is performed by, for example, saw singulation, resulting in individual integrated circuit packages 20 as shown in FIG. 2H.

Reference is now made to FIGS. 3A to 3H to describe a process for fabricating an integrated circuit package 20 according to another embodiment of the present invention. It will be appreciated that many of the process steps of the present embodiment are similar to those of the second described embodiment.

Figure 3A:
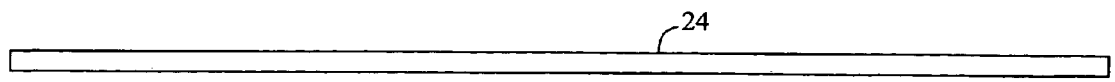
FIGS. 3A to 3H show processing steps for fabricating integrated circuit packages according to yet another embodiment of the present invention.

FIG. 3A shows a sectional side view of the Cu metal carrier 24 as shown in FIG. 1A.

Figure 3B:
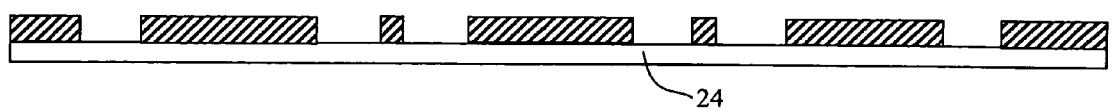

Referring to FIG. 3B, the metal carrier 24 is coated with a layer of photo-imageable solder mask and the solder mask is imaged and developed to provide the plating mask shown in FIG. 3B. In the present embodiment, the solder mask is thereby patterned to provide pits in which portions of the upper surface of the metal carrier 24 are exposed for plating up of the contacts 26. As in the second described embodiment, no pits are provided for plating up any die attach pads.

Figure 3C:
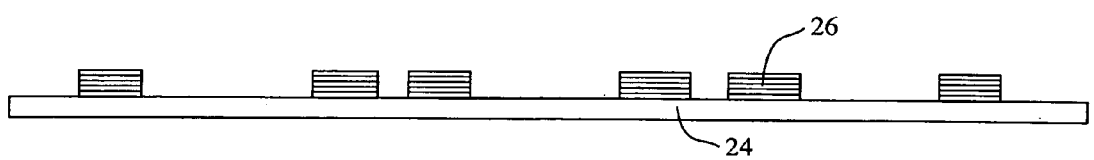

Layers of metals are then deposited by plating on the exposed portions of the metal carrier 24, in the pits in the solder mask, to form a plurality of contacts 26 for each package manufactured on the metal carrier 24 and the photo-imageable solder mask is stripped away (FIG. 3C).

Figure 3D:
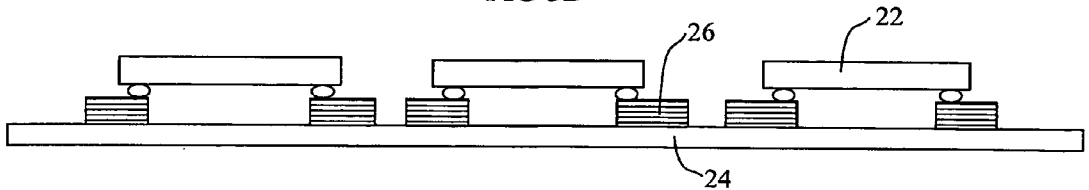

Referring now to FIG. 3D, singulated semiconductor dice 22 are then conventionally mounted in a flip chip orientation, each semiconductor die 22 being mounted to respective ones of the contacts 26. Thus, electrical connections are formed between each semiconductor die 22 and respective ones of the contacts 26.

Figure 3E:
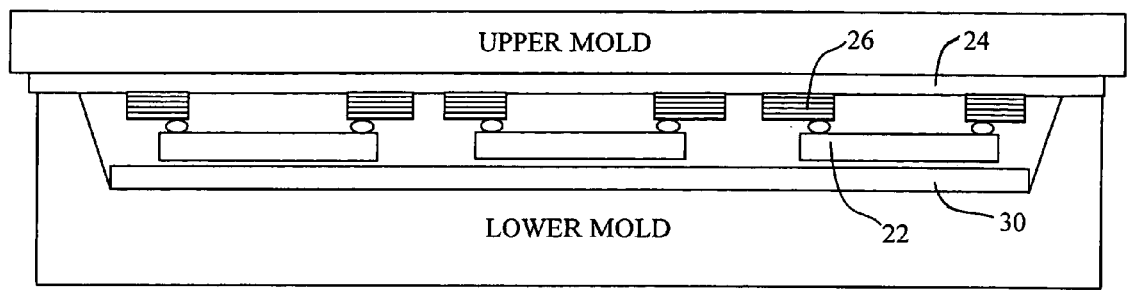

As in the first and second described embodiments, a copper metal strip 30 is placed on the lower surface of the lower mold die, in the mold cavity. The metal carrier 24 is then clamped to a surface of the upper mold die, at the top of the mold cavity such that the semiconductor die 22 protrudes from the metal carrier 24 into the mold cavity (FIG. 3E).

Figure 3F:
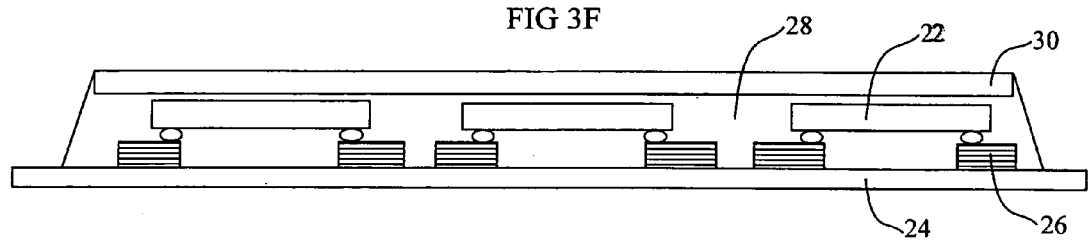

The integrated circuit packages 20 are encapsulated in the molding material 28, which surrounds the semiconductor die 22 by filling the mold cavity between the metal carrier 24 and the metal strip 30. After sufficient curing time, the molded packages 20 are removed from the mold in the form of a molded strip (FIG. 3F). As shown, the metal carrier 24 and the metal strip 30 are exposed, forming the lower and upper surfaces of the molded strip.

Figure 3G:
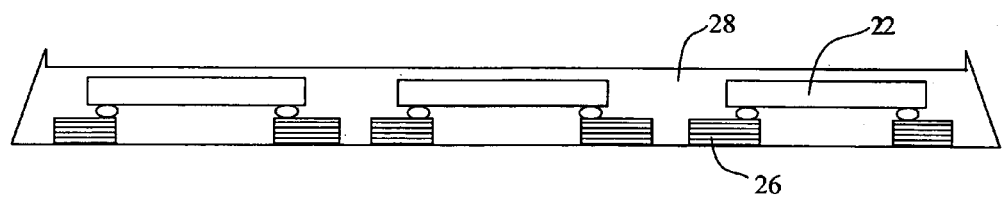

Next the molded strip is subjected to an alkaline etch via full immersion etching to remove the metal carrier 24 and the metal strip 30 and thereby expose the contacts 26 (FIG. 3G).

Figure 3H:
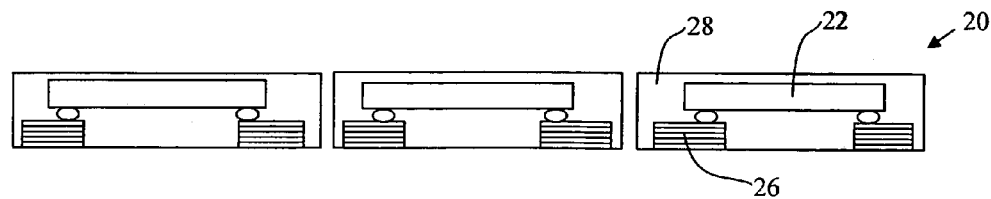

After etching, singulation of the individual integrated circuit packages 20 is performed by, for example, saw singulation, resulting in individual integrated circuit packages 20 as shown in FIG. 3H.

Reference is now made to FIGS. 4A to 4H to describe a process for fabricating an integrated circuit package 20 according to still another embodiment of the present invention. It will be appreciated that many of the process steps of the present embodiment are similar to those of the first described embodiment.

FIGS. 4A to 4D are similar to FIGS. 1A to 1D and therefore, these Figures and the related steps for fabricating the integrated circuit packages need not be further described herein.

Figure 4A:
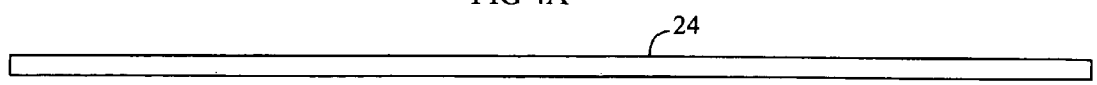
FIGS. 4A to 4H show processing steps for fabricating integrated circuit packages according to still another embodiment of the present invention.
Figure 4B:
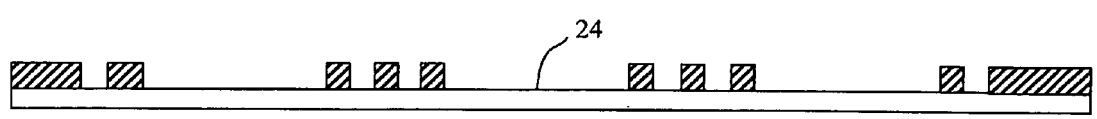
Figure 4C:
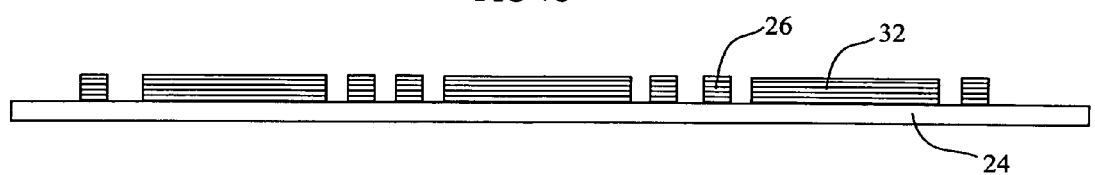
Figure 4D:
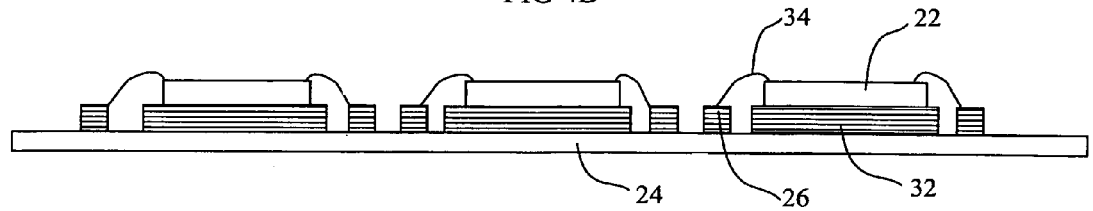
Figure 4E:
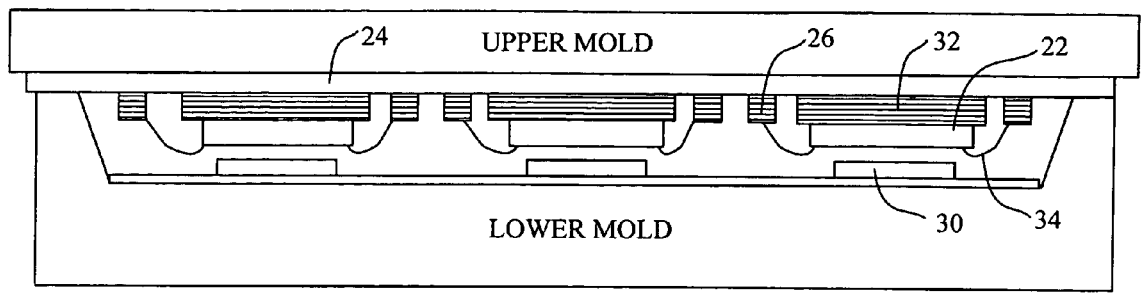

Referring to FIG. 4E, a copper metal strip 30 is placed on the lower surface of the lower mold die, in the mold cavity. In the present embodiment, the copper metal strip 30 is shaped with surface protrusions as shown. Features in the mold cavity and of the copper metal strip 30 are designed such that the copper metal strip 30 aligns with the metal carrier 24 in the cavity. The metal carrier 24 is then clamped to a surface of the upper mold die, at the top of the mold cavity such that the semiconductor die 22 protrudes from the metal carrier 24 into the mold cavity. Clamping of the metal carrier 24 is achieved by closing the upper and lower mold dies and pinching the edge of the metal carrier 24 in between.

Figure 4F:
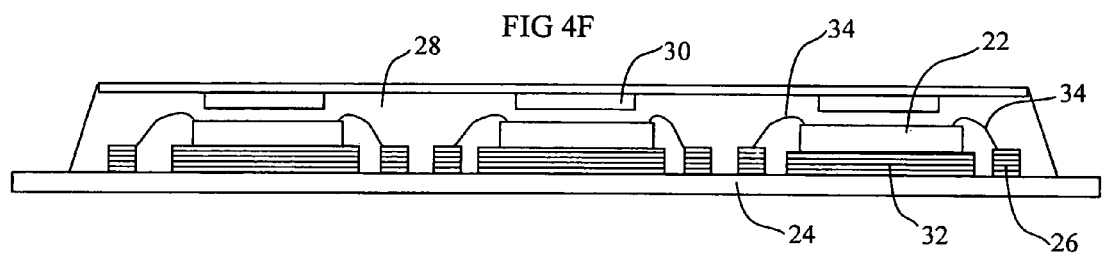

Next, each integrated circuit package 20 is encapsulated in the molding material 28 which surrounds the wire bonds 34 and the semiconductor die 22, filling the mold cavity between the metal carrier 24 and the metal strip 30. After sufficient curing time, the molded packages 20 are removed from the mold in the form of a molded strip (FIG. 4F). As shown, the metal carrier 24 and the metal strip 30 are exposed, forming the lower and upper surfaces of the molded strip.

Figure 4G:
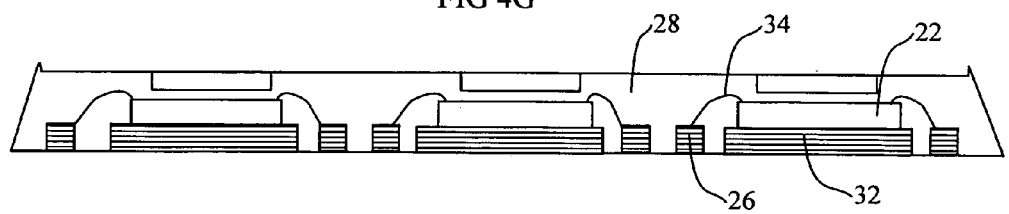

Next the molded strip is subjected to an alkaline etch via full immersion etching to remove the metal carrier 24 and the metal strip 30 and thereby expose the semiconductor die 22 and the contacts 26. In the present case, the surface of the individual packages 20 includes features that correspond with the protrusions from the metal strip 30. Thus, the packages 20 include depressions in the upper surfaces thereof (FIG. 4G).

Figure 4H:
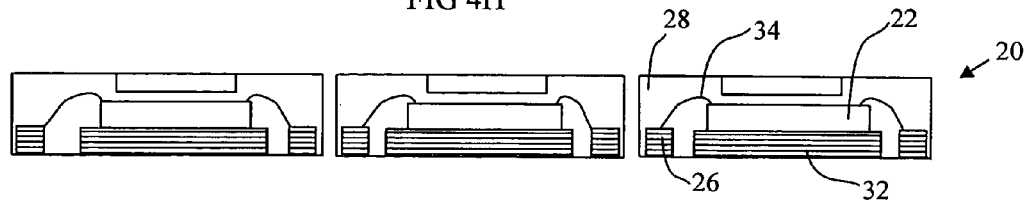

Singulation of the individual integrated circuit packages 20 is then performed by, for example, saw singulation, resulting in the individual integrated circuit packages 20 shown in FIG. 4H.

Specific embodiments of the present invention have been shown and described herein. However, modifications and variations to these embodiments are possible. For example, the metal carrier and the metal strip are both described as being copper. Other suitable materials are possible, such as iron-based alloys. Other modifications and variations may occur to those skilled in the art. All such modifications and variations are believed to be within the sphere and scope of the present invention.

What is claimed is:

1. A process for fabricating an integrated circuit package, comprising:
   mounting a semiconductor die on a first surface of a metal carrier and forming electrical connections between said semiconductor die and ones of a plurality of contacts on said metal carrier;
   molding using a molding material in a mold to thereby mold the semiconductor die and the contacts in the molding material, between said metal carrier and a metal strip;
   etching away said metal carrier and said metal strip; and
   singulating said integrated circuit package.

2. The process for fabricating the integrated circuit package according to claim 1, further comprising:
   placing one of said metal carrier and said metal strip in a mold cavity in the mold; and
   releasably clamping the other of said metal carrier and said metal strip to a die of said mold, prior to molding in said molding material.

3. The process for fabricating an integrated circuit package according to claim 1, wherein said semiconductor die is mounted to a die attach pad on said first surface of said metal carrier.

4. The process for fabricating the integrated circuit package according to claim 3, wherein said mounting said semiconductor die further comprises wire bonding said semiconductor die to ones of the contacts.

5. The process for fabricating the integrated circuit package according to claim 1, wherein said semiconductor die is directly mounted to said first surface of said metal carrier.

6. The process for fabricating the integrated circuit package according to claim 5, wherein said mounting said semiconductor die further comprises wire bonding said semiconductor die to ones of the contacts.

7. The process for fabricating the integrated circuit package according to claim 1, wherein mounting said semiconductor die comprises flip-chip mounting said semiconductor die to said plurality of contacts to thereby form said electrical connections.

8. The process for fabricating the integrated circuit package according to claim 1, first comprising selectively plating at least one layer of metal on said first surface of said metal carrier to provide said plurality of contacts, prior to mounting said semiconductor die.

9. The process for fabricating the integrated circuit package according to claim 3, first comprising selectively plating at least one layer of metal on said first surface of said metal carrier to provide said die attach pad and said plurality of contacts, prior to mounting said semiconductor die.

10. The process for fabricating the integrated circuit package according to claim 2, wherein said placing said one of said metal carrier and said metal strip in said mold cavity comprises placing said metal strip in said mold cavity such that said metal strip rests on a lower die of said mold and said releasably clamping comprises releasably clamping said metal carrier to an upper die of said mold.

11. The process according to claim 9, wherein said selectively plating comprises:
   depositing a plating mask on said first surface of said metal carrier;
   imaging and developing said plating mask to thereby expose portions of said metal carrier for plating said die attach pad and said contacts; and
   plating at least one metal layer on portions of said first surface of said metal carrier exposed by said imaging and developing to provide said die attach pad and said contacts.

12. The process according to claim 9, wherein selectively plating comprises selectively plating layers of gold, nickel and copper on said first surface of said metal carrier.

13. The process according to claim 1, wherein said metal carrier has a coefficient of thermal expansion that is about equal to a coefficient of thermal expansion of the metal strip.

14. The process according to claim 1, wherein the metal carrier is fabricated from a same metal as the metal strip.

15. A process for fabricating a plurality of integrated circuit packages, comprising:
   mounting a plurality of semiconductor dice on a first surface of a metal carrier and forming electrical connections between said semiconductor dice and respective ones of a plurality of contacts on said metal carrier;
   molding using a molding material in a mold to thereby mold the semiconductor dice and the contacts in the molding material, between said metal carrier and a metal strip;
   etching away said metal carrier and said metal strip; and
   singulating said integrated circuit packages.

16. The process for fabricating the plurality of integrated circuit packages according to claim 15, further comprising:
   placing one of said metal carrier and said metal strip in a mold cavity in the mold; and
   releasably clamping the other of said metal carrier and said metal strip to a die of said mold, prior to molding in said molding material.

17. The process for fabricating the plurality of integrated circuit packages according to claim 15, wherein said semiconductor dice are mounted to respective die attach pads on said first surface of said metal carrier.

18. The process for fabricating the plurality of integrated circuit packages according to claim 17, wherein said mounting said semiconductor die further comprises wire bonding said semiconductor dice to respective ones of the contacts.

19. The process for fabricating the plurality of integrated circuit packages according to claim 15, wherein said semiconductor dice are directly mounted to said first surface of said metal carrier.

20. The process for fabricating the plurality of integrated circuit packages according to claim 19, wherein said mounting said semiconductor dice further comprises wire bonding said semiconductor dice to respective ones of the contacts.

21. The process for fabricating the plurality of integrated circuit packages according to claim 15, wherein mounting said semiconductor dice comprises flip-chip mounting said semiconductor dice to said respective ones of said plurality of contacts to thereby form said electrical connections.

22. The process for fabricating the plurality of integrated circuit packages according to claim 15, first comprising selectively plating at least one layer of metal on said first surface of said metal carrier to provide said plurality of contacts, prior to mounting said semiconductor dice.

23. The process for fabricating the plurality of integrated circuit packages according to claim 17, first comprising selectively plating at least one layer of metal on said first surface of said metal carrier to provide said die attach pads and said plurality of contacts, prior to mounting said semiconductor dice.

24. The process for fabricating the plurality of integrated circuit packages according to claim 16, wherein said placing said one of said metal carrier and said metal strip in said mold cavity comprises placing said metal strip in said mold cavity such that said metal strip rests on a lower die of said mold and said releasably clamping comprises releasably clamping said metal carrier to an upper die of said mold.

25. The process according to claim 15, wherein said metal carrier has a coefficient of thermal expansion that is about equal to a coefficient of thermal expansion of the metal strip.

26. The process according to claim 15, wherein the metal carrier is fabricated from a same metal as the metal strip.

* * * * *